United States Patent
Miao et al.

(10) Patent No.: US 9,543,510 B2
(45) Date of Patent: Jan. 10, 2017

(54) MULTI-LAYER PHASE CHANGE MATERIAL

(71) Applicant: HUAZHONG UNIVERSITY OF SCIENCE AND TECHNOLOGY, Wuhan (CN)

(72) Inventors: Xiangshui Miao, Wuhan (CN); Hao Tong, Wuhan (CN); Xiaomin Cheng, Wuhan (CN)

(73) Assignee: HUAZHONG UNIVERSITY OF SCIENCE AND TECHNOLOGY, Wuhan (CN)

( * ) Notice: Subject to any disclaimer, the term of this patent is extended or adjusted under 35 U.S.C. 154(b) by 0 days.

(21) Appl. No.: 13/917,681

(22) Filed: Jun. 14, 2013

(65) Prior Publication Data
US 2013/0270503 A1   Oct. 17, 2013

Related U.S. Application Data

(63) Continuation-in-part of application No. PCT/CN2011/070450, filed on Jan. 21, 2011.

(30) Foreign Application Priority Data

Dec. 17, 2010   (CN) .......................... 2010 1 0595047

(51) Int. Cl.
*H01L 45/00*   (2006.01)

(52) U.S. Cl.
CPC ............. *H01L 45/06* (2013.01); *H01L 45/128* (2013.01); *H01L 45/1226* (2013.01);
(Continued)

(58) Field of Classification Search
CPC ...... H01L 45/06; H01L 45/141; H01L 45/144; H01L 27/249; G11C 13/0004; G11C 11/5678
(Continued)

(56) References Cited

U.S. PATENT DOCUMENTS

| | | | | |
|---|---|---|---|---|
| 2003/0080427 | A1* | 5/2003 | Hudgens | H01L 29/8615 257/748 |
| 2005/0051901 | A1* | 3/2005 | Chen | H01L 27/2436 257/758 |
| 2005/0263823 | A1* | 12/2005 | Hwang | H01L 29/7843 257/368 |
| 2008/0151608 | A1* | 6/2008 | Hosotani | G11C 11/16 365/158 |
| 2009/0180314 | A1* | 7/2009 | Liu | G11C 11/5678 365/163 |
| 2009/0189139 | A1* | 7/2009 | Schrott | H01L 45/06 257/3 |
| 2010/0055830 | A1* | 3/2010 | Chen | H01L 27/2436 438/102 |
| 2010/0264395 | A1* | 10/2010 | Liu | 257/2 |
| 2011/0310656 | A1* | 12/2011 | Kreupl et al. | 365/148 |

FOREIGN PATENT DOCUMENTS

| | | | |
|---|---|---|---|
| CN | 101807655 | * 8/2010 | |
| CN | 101540370 B | * 11/2010 | |
| CN | 101807665 | * 11/2010 | H01L 40/00 |

OTHER PUBLICATIONS

The Journal of Electrochemical Society, v 137, n 12, Dec. 1990, p. 3910-17.*

(Continued)

*Primary Examiner* — Dale E Page
*Assistant Examiner* — John Bodnar
(74) *Attorney, Agent, or Firm* — Matthias Scholl, PC; Matthias Scholl

(57) ABSTRACT

A multi-layer phase change material, including: a multi-layer film structure. The multi-layer film structure includes a plurality of periodic units. The periodic units each includes a first single-layer film phase change material and a second single-layer film phase change material. The first single-layer film phase change material and the second single-layer film phase change material are alternately stacked. The first single-layer film phase change material includes chemical components that are different from chemical components included in the second single-layer film phase change material, or the first single-layer film phase change material includes chemical components that are the same as chemical components included in the second single-layer film phase change material and a percent composition of the chemical components included in the first single-layer film phase
(Continued)

change material is different from a percent composition of the chemical components included in the second single-layer film phase change material.

13 Claims, 8 Drawing Sheets

(52) U.S. Cl.
CPC ........ *H01L 45/1233* (2013.01); *H01L 45/142* (2013.01); *H01L 45/143* (2013.01); *H01L 45/144* (2013.01); *H01L 45/145* (2013.01); *H01L 45/148* (2013.01); *H01L 45/1608* (2013.01); *H01L 45/1625* (2013.01)

(58) Field of Classification Search
USPC .......................................................... 257/2
See application file for complete search history.

(56) References Cited

OTHER PUBLICATIONS http://www.azom.com/properties.aspx?ArticleID=53.*
Ki-Hong Kim, Ju-Cheol Park1, Jun-Ho Lee, Jae-Gwan Chung, Sung Heo, and Sang-Jun Choi "Nitrogen-Doping Effect on Ge2Sb2Te5 Chalcogenide Alloy Films during Annealing" Japanese Journal of Applied Physics, 49, (2010), 101201, pp. 1-4.*
http://www.azom.com/properties.aspx?ArticleID=53).*

* cited by examiner

US 9,543,510 B2

MULTI-LAYER PHASE CHANGE MATERIAL

CROSS-REFERENCE TO RELATED APPLICATIONS

This application is a continuation-in-part of International Patent Application No. PCT/CN2011/070450 with an international filing date of Jan. 21, 2011, designating the United States, now pending, and further claims priority benefits to Chinese Patent Application No. 201010595047.9 filed Dec. 17, 2010. The contents of all of the aforementioned applications, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 14781 Memorial Drive, Suite 1319, Houston, Tex. 77079.

BACKGROUND OF THE INVENTION

Field of the Invention

The invention relates to a recording material for a semiconductor memory, and more particularly, to a multi-layer phase change material having low thermal conductivity.

Description of the Related Art

Typical memories are divided into three types: magnetic memories, optical memories, and semiconductor memories, amongst, the semiconductor memories are widely used because of their excellent performance. Main semiconductor memories that are currently used are flash disks based on a floating gate structure. However, due to the thickness of the floating gate, semiconductor memories cannot break through the bottleneck of a size of 32 nm with the further development of IC (Integrated Circuit) technology, people now begin to competitively develop the next-generation memories represented by phase change random access memories (PCRAM).

A PCRAM is a nonvolatile semiconductor memory utilizing heat effect of electric pulses to facilitate reversible change of a recording material between a crystalline state and an amorphous state, thus storing data via big difference in resistance values under the two states. The recording material is made of film phase change materials mainly including chalcogenide compounds, a crystalline state thereof is a low resistance state representing a data bit "1", and an amorphous state thereof is a high resistance state representing a data bit "0". Temperature required for changing a phase change material from the amorphous state to the crystalline state is referred to as crystallization temperature, and temperature required for changing the phase change material from the crystalline state to the amorphous state is referred to as melting temperature.

Since advent of the PCRAM, it has received much concern due to its good performance in no volatility, compatibility with the CMOS technique, high-speed, resistance to radiation, low-price, and long service life. The Semiconductor Industry Association regards the PCRAM as a mainstream memory product in the future capable of replacing existing products such as flash disks, DRAMs and so on. However, with reduction in size of the PCRAM, distance between adjacent memory cells also decreases. Upon reading or writing a memory cell, heat generated resulting therefrom is inevitably transferred to adjacent memory cells. Once temperature rise of the adjacent memory cells caused by heat transfer exceeds phase change temperature of a recording material, unintended variation of a recording state of the memory cell will occur, and heat interference between adjacent memory cells will greatly affect reliability of the memory. Moreover, melting temperature of existing recording materials is comparatively high, and thus thermal energy required for phase change thereof is comparatively high. As a result, large power consumption becomes another big bottleneck that restricts further application of the PCRAM.

To improve reliability of the PCRAM, a common-used method is to mix elements such as N, O, Sn and so on into the film phase change material, thereby increasing crystallization temperature of a recording material and preventing errors of data bits caused by temperature rise of adjacent memory cells exceeding phase change temperature of recording materials thereof. Although temperature rise does not result in fast change of a state of the recording material, the method does not reduce heat transferred to adjacent memory cells, a resistance value of the recording material is significantly changed, and data bits are easy to fail after many times of operation, and thus a work life of the memory is greatly affected. Nevertheless, as the crystallization temperature is raised, melting temperature of the film phase change material is correspondingly increased, which results in higher power consumption of the PCRAM.

To summarize, it is very urgent to provide a phase change material with good thermal performance that is capable of reducing heat interference between adjacent memory cells of the PCRAM and power consumption thereof.

SUMMARY OF THE INVENTION

It is an objective of the invention to provide a multi-layer phase change material having low thermal conductivity that is capable of effectively reducing heat interference between adjacent memory cells of the PCRAM, and power consumption thereof.

To achieve the above objective, in accordance with one embodiment of the invention, there is provided a multi-layer phase change material, comprising: a multi-layer film structure formed by a plurality of periodic units comprising two types of single-layer film phase change material. The two types of single-layer film phase change material are alternately stacked on each other, and composition elements of the two types of single-layer film phase change material are not the same, or the same but have different atomic percentages.

In a class of this embodiment, the single-layer film phase change material is a one selected from the group consisting of GeTe, SbTe, BiTe, SnTe, AsTe, GeSe, SbSe, BiSe, SnSe, AsSe, InSe, GeSbTe, and AgInSbTe, or a mixture formed by doping any one thereof with an element of S, N, O, Cu, Si, or Au.

In a class of this embodiment, an atomic percentage of the mixed element in the single-layer film phase change material is between 0.5% and 50%.

In a class of this embodiment, a thickness of the single-layer film phase change material is between 0.5 nm and 5 nm.

In a class of this embodiment, the single-layer film phase change materials have the same crystal structure, and lattice constants thereof are close to each other.

A method for preparing a multi-layer phase change material, comprising:
1) depositing a first layer made of a film phase change material A on a substrate, and depositing a second layer made of a film phase change material B on the first layer, whereby forming a first periodic unit;
2) depositing a third layer made of the film phase change material A on the film phase change material B, and depositing a fourth layer made of the film phase change material B on the third layer, whereby forming a second periodic unit; and 3) repeating the above two steps to yield a multi-layer film structure.

The invention further provides a sample for testing thermal conductivity of a multi-layer phase change material. The sample provides two layers made of an insulating and heat conducting material, and a multi-layer phase change material. The multi-layer phase change material is disposed between the layers made of an insulating and heat conducting material, one layer made of an insulating and heat conducting material is deposited on a Si substrate, and the other layer made of the insulating and heat conducting material is deposited with a metal strip.

In a class of this embodiment, a thermal conductivity of the insulating and heat conducting material is greater than 1 W/mK.

In a class of this embodiment, a thickness of the insulating and heat conducting material is between 5 nm and 20 nm.

In a class of this embodiment, the metal strip is I-shaped.

Advantages of the invention are summarized as follow. The multi-layer phase change material of the invention features comparatively low thermal conductivity, and is capable of effectively reducing temperature rise of adjacent memory cells caused by reading or writing a memory cell as a recording material of a PCRAM, and heat interference between adjacent memory cells, and improving stability of the memory. At the meantime, with decrease of a threshold voltage of the PCRAM, power consumption thereof is correspondingly reduced. The material does no need to introduce other non-phase change materials, and is compatible with existing preparing methods.

Figure 1:
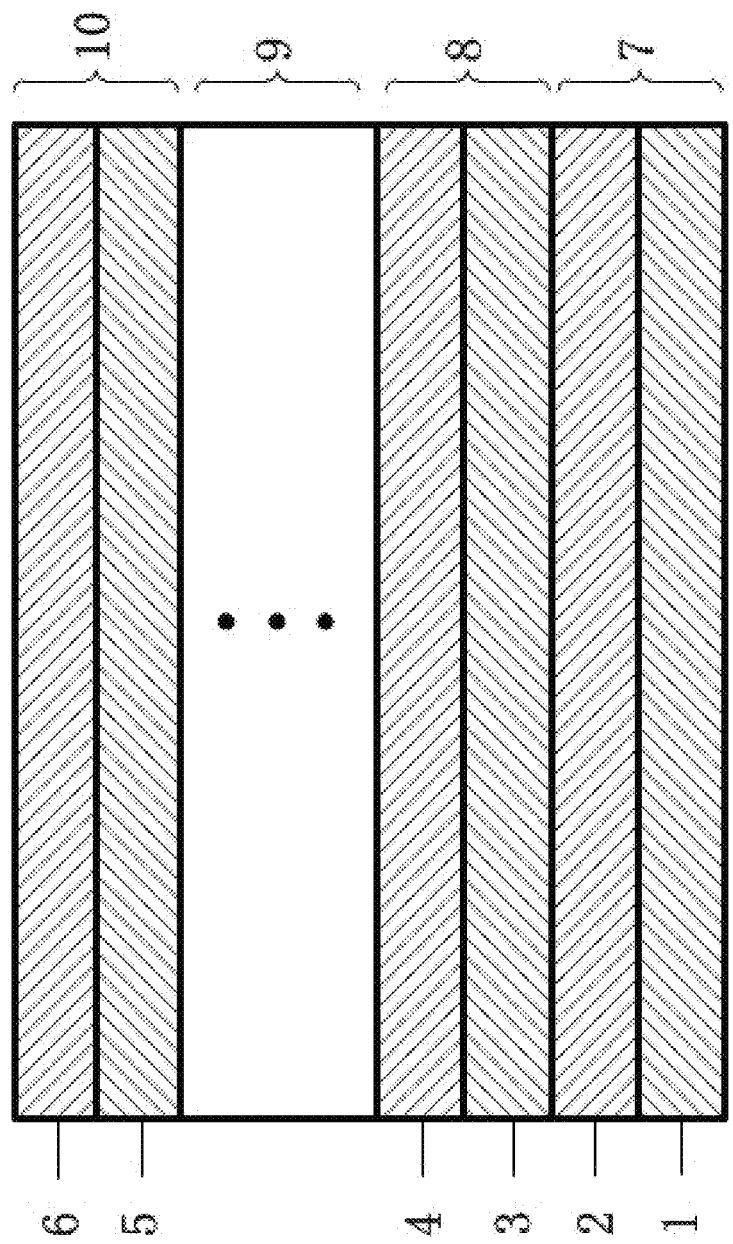
FIG. 1 is a schematic view of a multi-layer phase change material of an exemplary embodiment of the invention.

In the drawings, the following reference numbers are used: 1. First film material layer; 2. Second film material layer; 3. Third film material layer; 4. Fourth film material layer; 5. Last second film material layer; 6. Last film material layer; 7. First periodic unit; 8. Second periodic unit; 9. $(N-3)^{th}$ periodic unit; 10. Last periodic unit; 11. Additional film material; 12. Si substrate; 13. Lower insulating and heat conducting material; 14. Upper insulating and heat conducting material; 15. Heating electrode; 16. Multi-layer phase change material of the invention; 17. Left pad; 18. Metal strip; 19. Right pan; 20. Substrate; 21. Lower electrode; 22. Phase change layer; 23. insulating layer; 24. Upper electrode; 25. Memory cell in operation; 26. Adjacent memory cell; 27. Direct-current I-V curve of multi-layer phase change material of the invention; 28. Direct-current I-V curve of Ge2Sb2Te5; 29. Direct-current I-V curve of Ge2Sb2Te5 mixed with N.

DETAILED DESCRIPTION OF THE EMBODIMENTS

Further description will be given below in conjunction with accompanying drawings and specific embodiments.

As shown in FIG. 1, the structure of a multi-layer phase change material of the invention is as follows: a second film material layer 2 is stacked on a first film material layer 1 whereby forming a first periodic unit 7, a third film material layer 3 is stacked on the second film material layer 2, and a fourth film material layer 4 is stacked on the third film material layer 3 whereby forming a second periodic unit 8, and so on . . . and finally $N-3$ ($N \geq 10$) periodic units 9 are formed on the fourth film material layer 4, and a last film material layer 6 is stacked on a last second film material layer 5 whereby forming a last periodic unit 10. The same film material layer in different periodic units is made of the same material, and two film material layers in the same periodic unit are made of different materials. For example, the first film material layer 1 of the first periodic unit 7, the third film material layer 3 of the second periodic unit 8, and the last second film material layer 5 of the last periodic unit 10 are made of the same material A, the second film material layer 2 of the first periodic unit 7, the fourth film material layer 4 of the second periodic unit 8, and the last film material layer 6 of the last periodic unit 10 are made of the same material B. The film material A has at least one composition element indifferent from the film material B, or both have the same element composition, but atomic percentages thereof are different. Thus, two types of single-layer film materials alternately stacked on each other form the multi-layer film structure.

The two single-layer film materials are made of phase change materials, so as to guarantee phase change characteristics of the multi-layer phase change material. As a long and weak electric pulse is applied, heat generated resulting therefrom enables temperature of the single-layer material to rise above the crystallization temperature and maintain for enough atomic relaxation time, and the material is change from a disordered amorphous state to an ordered crystalline state. As a short and strong electric pulse is applied, heat generated resulting therefrom enables temperature of the single-layer material to rise above the melting temperature and quickly cool down, and the material to change from the ordered crystalline state to the disordered amorphous state. Namely, the two single-layer film materials forming the multi-layer phase change material can facilitate reversible change of states under the action of thermal energy.

Generally, an amorphous state resistance of the single-layer film material forming the multi-layer phase change material of the invention is greater than a crystalline state resistance, and a ratio between the amorphous state resistance and the crystalline state resistance is greater than 5. Particularly, the ratio between the amorphous state resistance and the crystalline state resistance is greater than 500,000.

Generally, the crystallization temperature of the single-layer film material forming the multi-layer phase change material of the invention is greater than 80° C., and the melting temperature thereof is less than 1,000° C. Particularly, the crystallization temperature of the single-layer film material forming the multi-layer phase change material of the invention is greater than 100° C., and the melting temperature thereof is less than 800° C.

The multi-layer film structure introduces a number of interfaces for the material. Under interface scattering, movement of phonons in a direction vertical to film surface is hindered, and thus additional interface phonon resistance is generated. Since the phonon is a main heat carrier in a semiconductor, and macroscopic thermal conductivity of a semiconductor material is determined by the phonon, so the interface phonon resistance may generate a significant interface thermal resistance, and thus reducing thermal conductivity of the material. Reduction of the thermal conductivity of the material means decrease in scattering energy thereof, and greatly improved capability of accumulating heat. Namely, reduction of the thermal conductivity of the material may improve thermal property of the multi-layer phase change material.

To introduce a number of interfaces, the two materials forming the multi-layer phase change material of the invention are different, at least one composition element of one of them is different from that of the other (for example one is GeTe and the other is $Sb_2Te_3$), or they have the same element, but atomic percentages thereof are different (for example one is $Ge_1Sb_2Te_4$ and the other is $Ge_2Sb_2Te_5$).

The thickness of the single-layer film material forming the multi-layer phase change material of the invention is between 0.5 nm and 5 nm. If the thickness of the single-layer film material is less than a mean free path of a phonon in the material, a probability that the phonon is scattered by the interface will further increase, and the thermal conductivity of the material will be much smaller. A mean free path of a phonon in a normal material at room temperature is approximately few nanometers to tens of nanometers.

Specifically, the single-layer film material forming the multi-layer phase change material of the invention comprises the following chalcogenide compounds: GeTe, SbTe, BiTe, SnTe, AsTe, GeSe, SbSe, BiSe, SnSe, AsSe, InSe, GeSbTe, AgInSbTe, and a mixture formed by doping any one thereof with an element of S, N, O, Cu, Si, or Au, and atomic percentage thereof is variable.

Generally, the two materials forming the multi-layer phase change material of the invention can be any combination of various film phase change materials. Particularly, the two materials forming the multi-layer phase change material of the invention have the same crystal structure, and lattice constants thereof are close to each other (lattice mismatch is less than 10%), then the multi-layer phase change material of the invention becomes a superlattice phase change material in crystallography, for example, $Sb_2Te_3$ and $Bi_2Te_3$ are rhombohedral and triangle crystal systems, and $Ge_1Sb_4Te_7$ and $Ge_2Sb_2Te_5$ are face-centered cubic structures.

In the superlattice phase change material, a periodic potential field along a growth direction will result in localization of phonons, and significant reduction of mean free paths of thereof. In addition, band-edge folding of phonon spectrum will cause speeds of phonon groups to decrease. It is known from lattice dynamics that thermal conductivity of the phonon is proportional to a mean free path thereof and the speed of the phonon group, and therefore, the thermal conductivity of the superlattice phase change material is even smaller.

Upon preparing the multi-layer phase change material having low thermal conductivity, firstly the first film material layer 1 is deposited on a substrate via methods such as vapor plating, sputtering, epitaxy and so on, and then the second film material layer 2 is deposited on the first film material layer 1 via the same method whereby forming the periodic unit 7. After that, the third film material layer 3 is deposited on the second film material layer 2, and the fourth film material layer 4 is deposited on the third film material layer 3 whereby forming the second periodic unit 8, and so on, until the last periodic unit 10 is formed. Thus the multi-layer phase change material of the invention is obtained.

Figure 2:
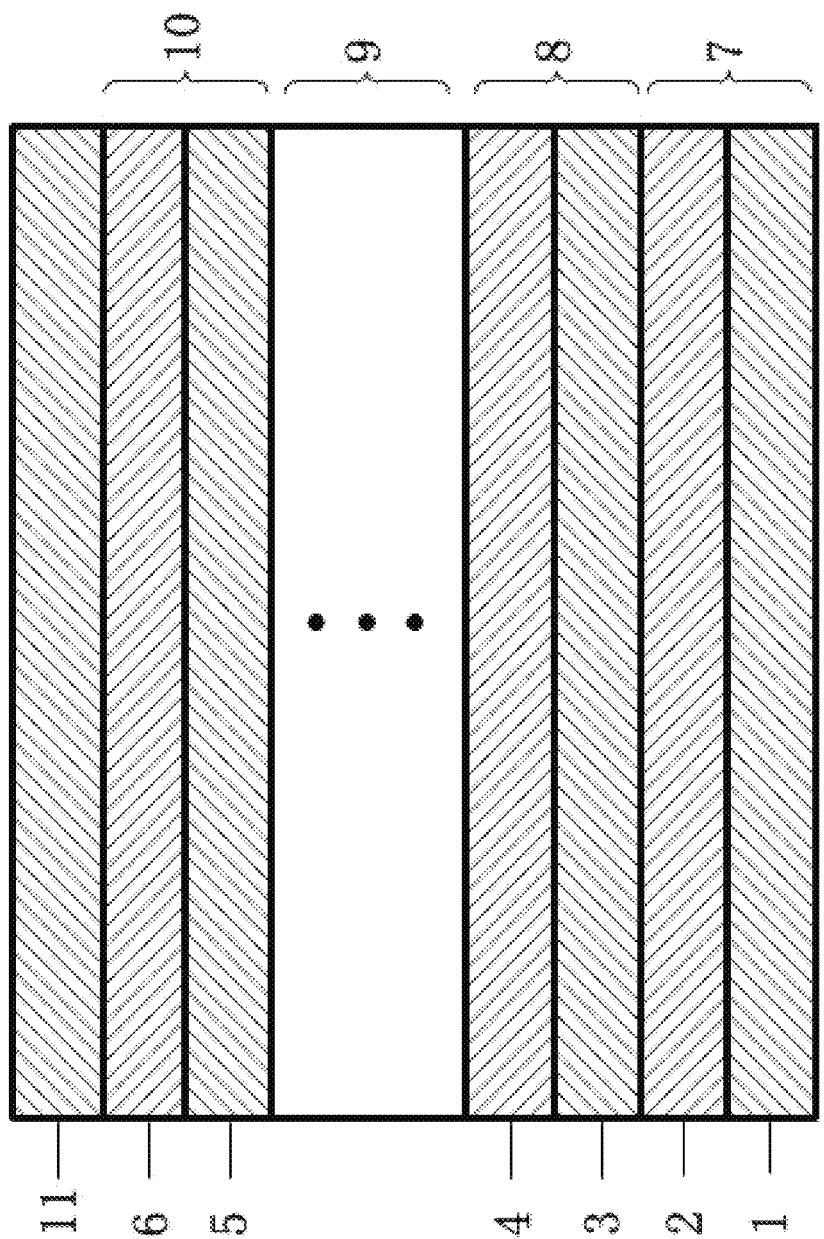
FIG. 2 is a schematic view of a multi-layer phase change material of another exemplary embodiment of the invention.

FIG. 2 illustrates another structure of a multi-layer phase change material of the invention: the second film material layer 2 is stacked on the first film material layer 1 whereby forming the first periodic unit 7, the third film material layer 3 is stacked on the second film material layer 2, and the fourth film material layer 4 is stacked on the third film material layer 3 whereby forming the second periodic unit 8, and so on, finally N−3 (N≥10) periodic units 9 are formed on the fourth film material layer 4, the last film material layer 6 is stacked on the last second film material layer 5 whereby forming the last periodic unit 10. An additional film material 11 is stacked on the last periodic unit 10.

The same film material layer in different periodic units is made of the same material, and two film material layers in the same periodic unit are made of different materials. For example, The first film material layer 1 of the first periodic unit 7, the third film material layer 3 of the second periodic unit 8, and the last second film material layer 5 of the last periodic unit 10 are made of the same material A, the second film material layer 2 of the first periodic unit 7, the fourth film material layer 4 of the second periodic unit 8, and the last film material layer 6 of the last periodic unit 10 are made of the same material B. Both of the two film materials are phase change materials both having at least one composition element different from each other, or the same composition element but different atomic percentage. Thickness of the single-layer film material is between 0.5 nm and 5 nm. The additional film material 11 and the first film material layer 1 are the same kind of phase change material that does not destroy periodicity of the film material, these two types of single-layer film materials are alternately stacked on each other whereby forming the periodic multi-layer film structure.

To understand thermal property of the multi-layer phase change material of the invention, thermal conductivity thereof is to be accurately measured. A common-used '3ω' method directly covers a heating electrode at the surface of a test material, applies electric pulses thereto, and obtains a feedback voltage signal therefrom. However, resistance of the multi-layer phase change material of the invention under the crystalline state is very small, and shunt of the electric pulses caused thereby will result in comparatively large deviation of test results. Therefore, it is required to design a special sample structure for testing the thermal conductivity of the multi-layer phase change material of the invention.

Figure 3:
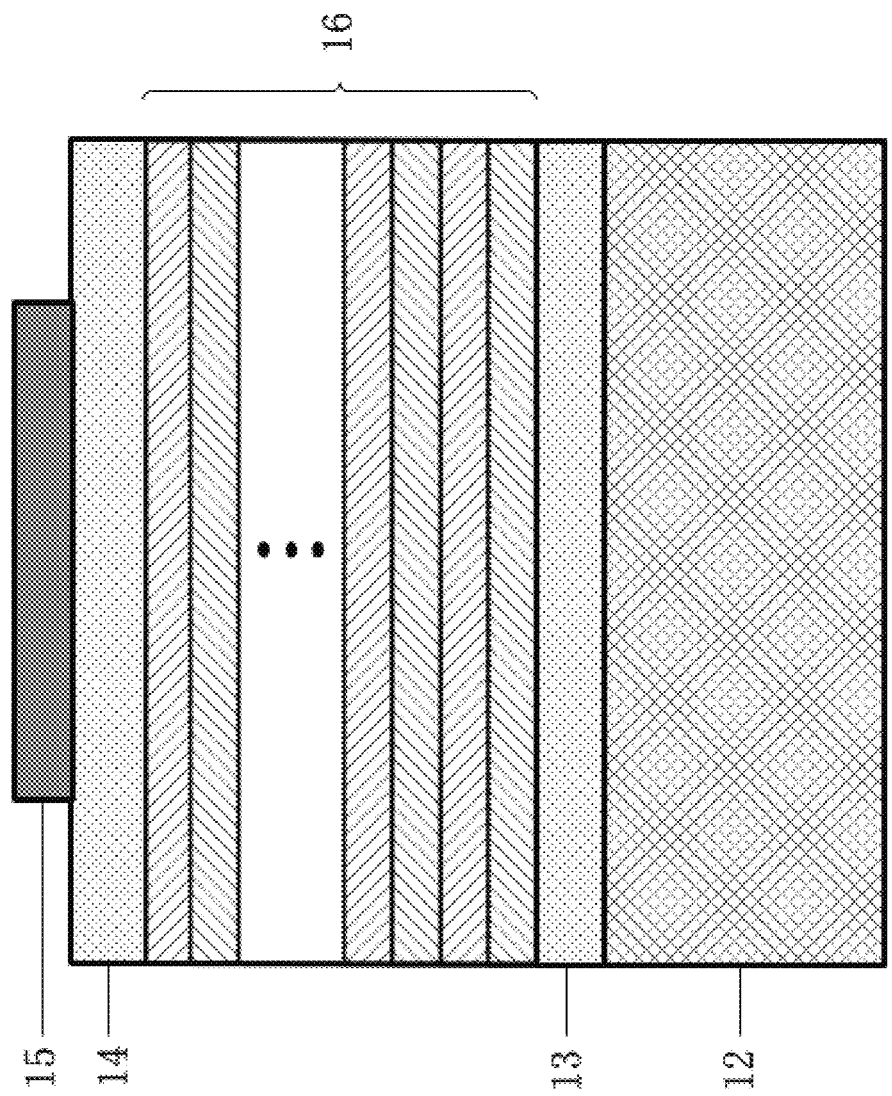
FIG. 3 is a schematic view of a sample for testing thermal conductivity of a multi-layer phase change material of the invention.

FIG. 3 is a schematic view of a sample for testing the thermal conductivity of the multi-layer phase change material of the invention: a lower insulating and heat conducting material 13 is covered on a Si substrate 12, the multi-layer phase change material of the invention 16 is clamped between the lower insulating and heat conducting material 13 and an upper insulating and heat conducting material 14, and the heating electrode 15 is deposited on the surface of the upper insulating and heat conducting material 14.

In the sample for testing the thermal conductivity of the multi-layer phase change material of the invention, the lower insulating and heat conducting material 13 and the upper insulating and heat conducting material 14 can electrically insulate an applied electric signal, and prevent measurement inaccuracy resulted from shunt of a test phase change material. Moreover, relative thermal conductivity (relative to the phase change material) can prevent heat loss in the insulating layer during heat transfer, and thus ensuring accuracy of test.

The thermal conductivity of the phase change material is between 0.01 W/mK and 0.5 W/mK. Generally, the thermal conductivity of the lower insulating and heat conducting material 13 and the upper insulating and heat conducting material 14 is greater than 1 W/mK. Particularly, the thermal conductivity of the lower insulating and heat conducting material 13 and the upper insulating and heat conducting material 14 is greater than 5 W/mK. Under this condition, the lower insulating and heat conducting material 13 and the upper insulating and heat conducting material 14 are hot good conductors relative to the multi-layer phase change material 16, and thus test accuracy is greatly improved.

Particularly, to reduce heat loss on the insulating layer, the thickness of the lower insulating and heat conducting material 13 and the upper insulating and heat conducting material 14 is not greater than 20 nm.

Due to existence of the lower insulating and heat conducting material 13 and the upper insulating and heat conducting material 14, the structure can employ a traditional '3ω' method only applicable to insulating materials before to test thermal conductivity of semiconductor film materials. Upon testing the thermal conductivity of the multi-layer phase change material, alternating current I with a frequency ω passes the top of a left pan 17 and a right pan 19, and is applied on a metal strip 18. Under heating of the current, the metal strip 18 generates a double frequency heating power, and temperature rise having a frequency of 2ω, and thus a resistor of the metal strip fluctuates at a frequency of 2ω, and then is coupled with current with a frequency of ω, whereby generating a triple frequency voltage. The triple frequency voltage can be tested at the bottom of the left pan 17 and the right pan 19 via a lock-in amplifier, and then amplitude of temperature rise of the metal strip 18 can be obtained. Since the amplitude of temperature rise of the metal strip 18 is inversely proportional to the thermal conductivity of the multi-layer phase change material 16 of the invention, the method is capable of obtaining the thermal conductivity of the phase change material 16 of the invention.

Generally, the metal strip 18 can be formed by a single-layer metal film. Particularly, the metal strip 18 can be formed by multiple metal layers made from Ni/Ag, Ni/Au and so on, thereby improving adhesion and thermal conductivity between the metal strip 18 and the upper insulating and heat conducting material 14.

Figure 4:
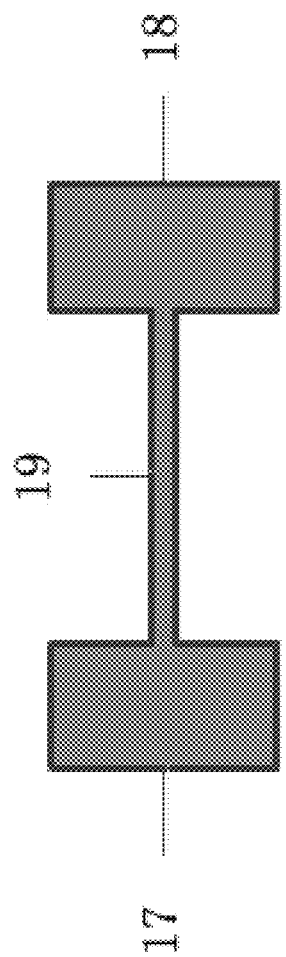
FIG. 4 is a bottom view of a metal strip of a sample for testing thermal conductivity of a multi-layer phase change material of the invention.

FIG. 4 is a bottom view of the heating electrode 15 of the sample for testing the thermal conductivity of the multi-layer phase change material of the invention. In the sample for testing the thermal conductivity of the multi-layer phase change material of the invention, an I-shaped new structure is used to replace a four-pan-structure in a traditional '3ω' method. A specific structure thereof is: two ends of a narrow and long metal strip 18 are respectively connected to the left pan 17 and the right pan 19 whereby forming an I-shaped structure, and the metal strip 18, the left pan 17 and the right pan 19 are made of the same metal. As far as the I-shaped structure is concerned, production thereof is more convenient, circuit break is uneasy to occur, and its welding with external circuit is more flexible.

Figure 5:
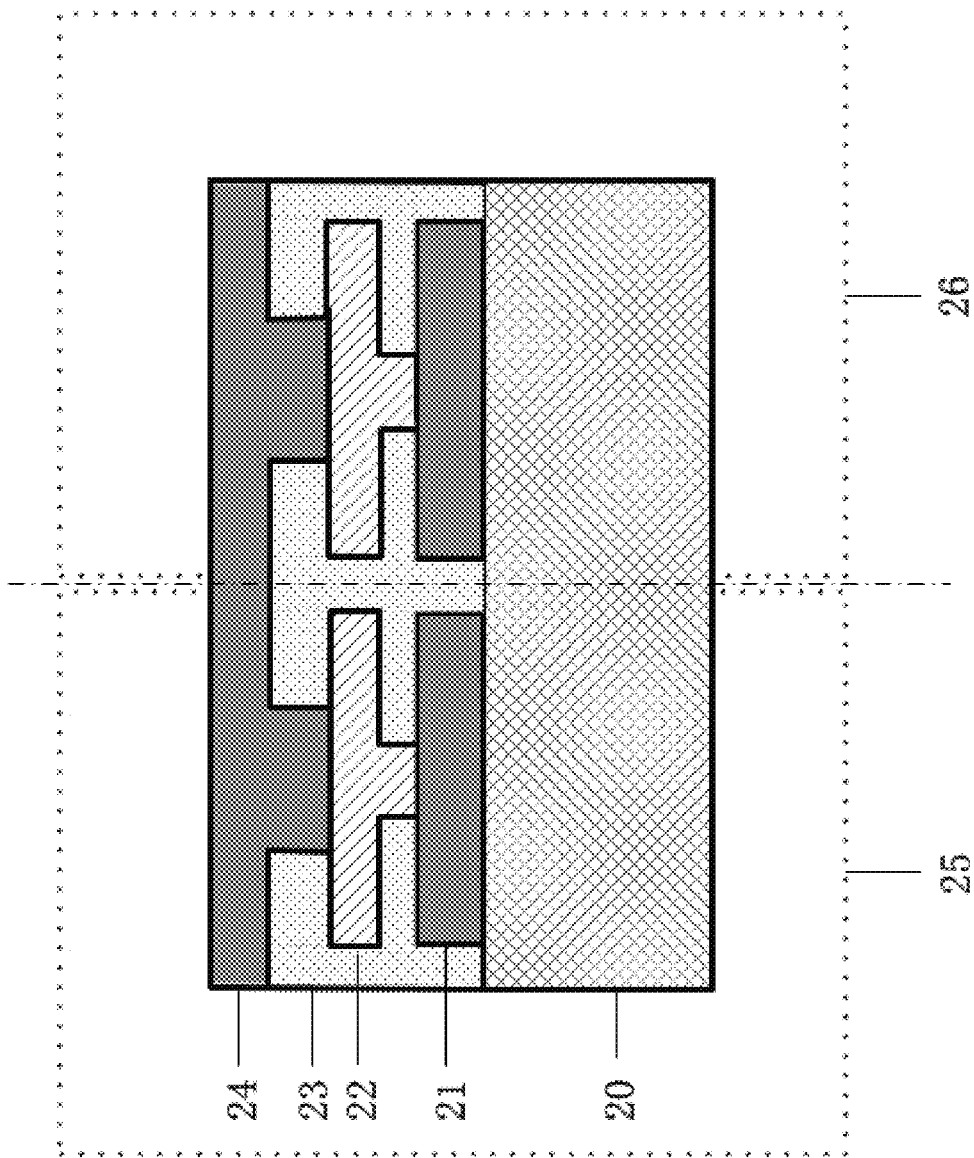
FIG. 5 illustrates simulation of heat interference between adjacent memory cells.

FIG. 5 illustrates simulation of thermal interference between adjacent memory cells: a memory cell in operation 25 is tightly connected to an adjacent memory cell 26, and recording materials of the two memory cells are separated via an insulating layer 23, upper electrodes 24 thereof are connected to each other, lower electrodes 21 thereof are also separated via the insulating layer 23. The two memory cells have the same structure, where a phase change layer 22 is disposed between the upper electrode 24 and the lower electrode 21, the phase change layer 22 forms a T-shaped structure, the rest space is filled with the insulating layer 23, and the lower electrode 24 is covered on the substrate 20.

During simulation, the memory cell 25 is operated, short and strong current pulses are applied thereto via the upper electrode 24 and the lower electrode 21, so that temperature of the phase change layer 22 rises above the melting temperature. After that, temperature distribution of each point in space of the adjacent memory cell 26, especially in the phase change layer, is calculated via thermodynamics analysis software, and finally thermal interference under the situation can be determined.

Figure 6:
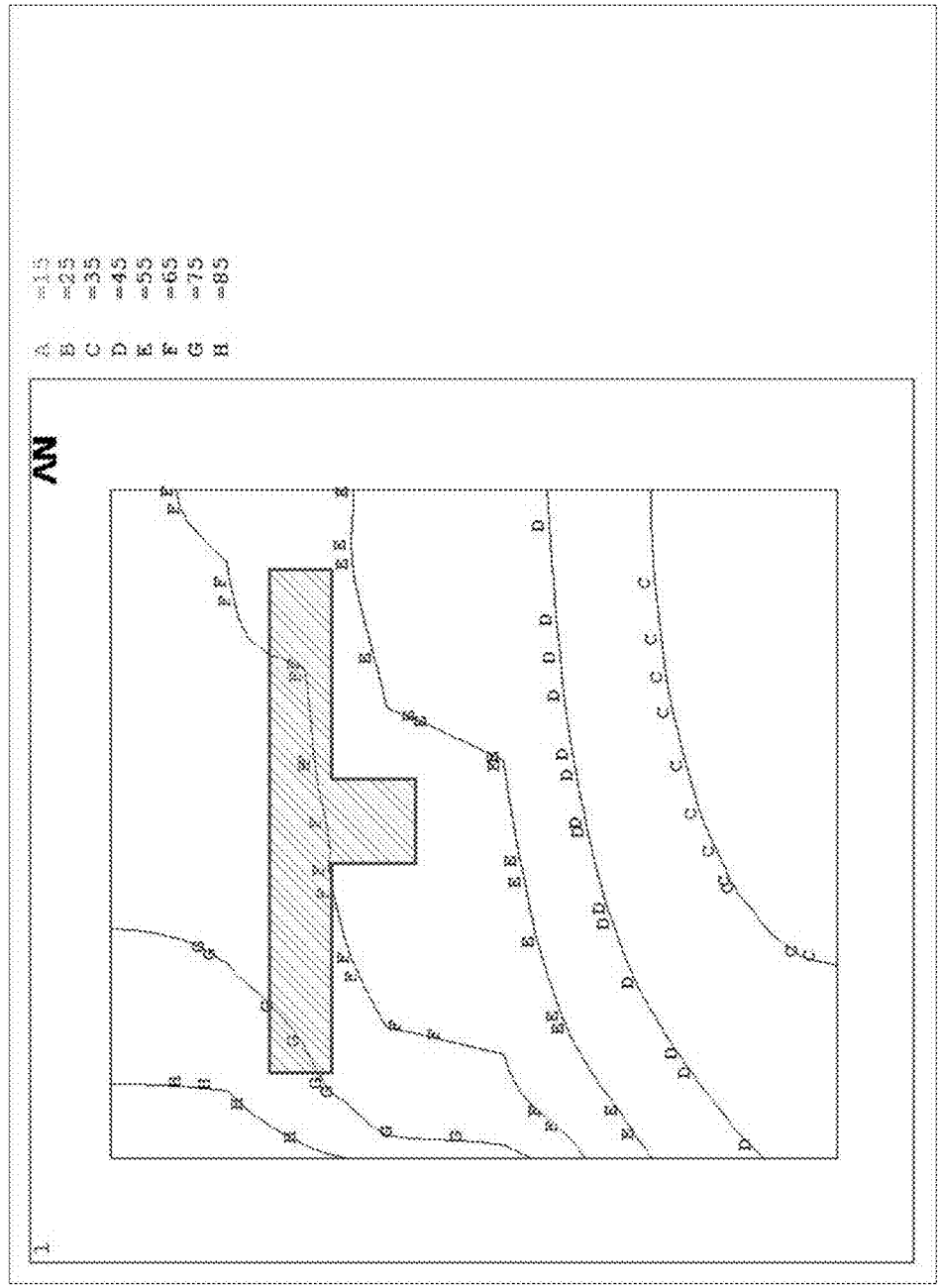
FIG. 6 is a graph illustrating distribution of temperature rise of adjacent memory cells caused by a common-used phase change material.

FIG. 6 is a graph illustrating distribution of temperature rise of adjacent memory cells caused by a common-used phase change material. The graph is obtained via software simulation, where temperature distribution is represented in the format of an isotherm, a T-shaped region is a region of a phase change material, representing the adjacent memory cell 26. It can be clearly seen from the graph that heat transferred from the memory cell in operation 25 causes a temperature distribution gradient, and temperature of the adjacent memory cell 26 reaches above 65° C., which indicates there is strong thermal interference, and reliability of the memory will be greatly affected.

Besides the T-shaped phase change layer 22, the invention can also be applicable for linear, asymmetric or edge-contacted ones.

Figure 7:
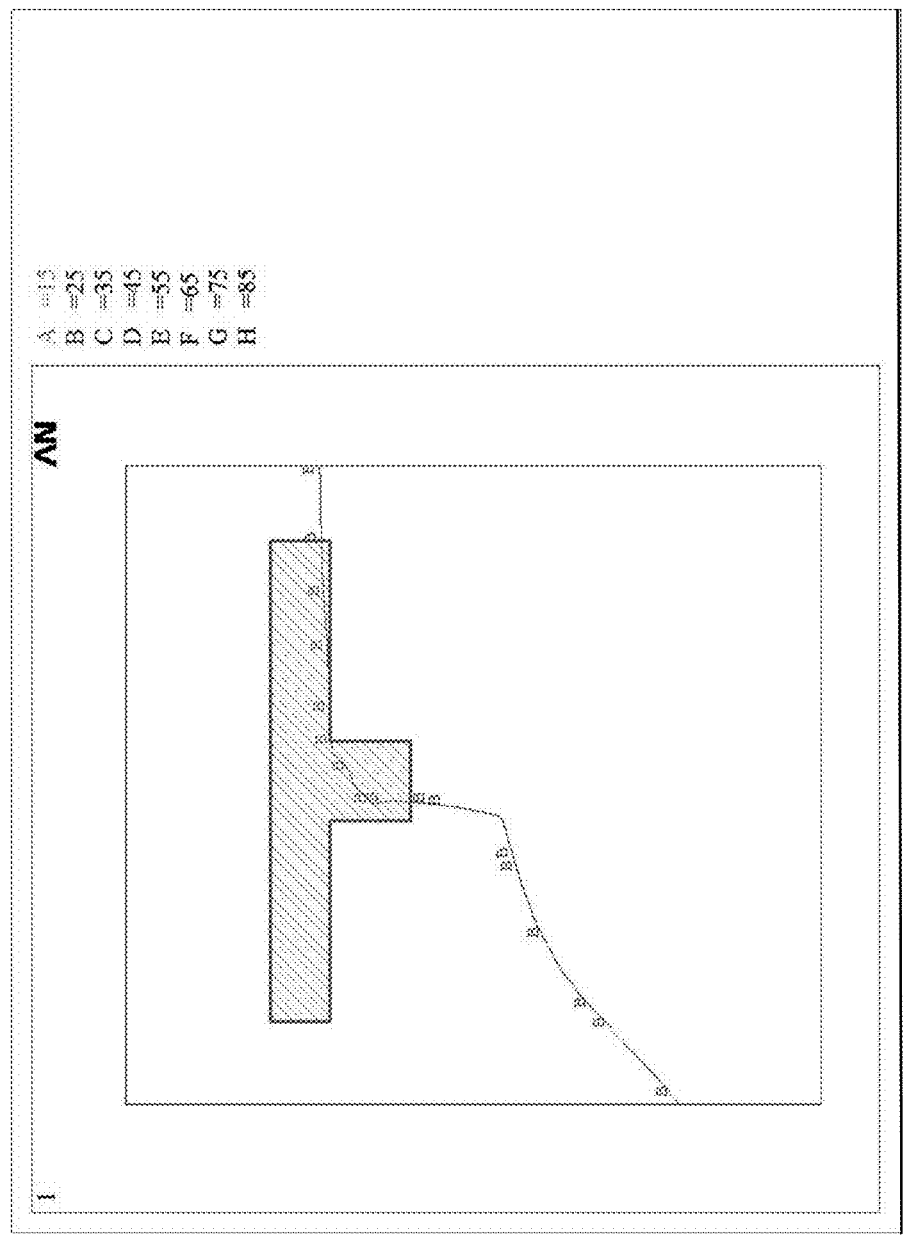
FIG. 7 is a graph illustrating distribution of temperature rise of adjacent memory cells caused by a multi-layer phase change material of the invention.

FIG. 7 is a graph illustrating distribution of temperature rise of adjacent memory cells caused by a multi-layer phase change material of the invention. It can be seen from the graph that the memory cell almost has no temperature distribution gradient, and temperature of the phase change layer is maintained at approximately 25° C., which is room temperature. This indicates heat generated by the memory cell in operation 25 is rarely transferred to the adjacent memory cell 26. This multi-layer phase change material has strong capability of accumulating heat, and is capable of effectively preventing heat diffusion.

Since the phase change material has the strong capability of accumulating heat, the multi-layer phase change material of the invention features high utilization rate of thermal energy, and thus can significantly reduce power consumption of the memory.

Examples will be given below: A 20-cycle GeTe/Sb$_2$Te$_3$ multi-layer phase change material is used to illustrate a method for preparing a phase change material of the invention. The two materials GeTe and Sb$_2$Te$_3$ forming the GeTe/Sb$_2$Te$_3$ multi-layer phase change material are phase change materials. Crystallization temperature of GeTe is 192° C., melting temperature thereof is 710° C., and a resistance value in the crystalline state is 100,000 times greater than that in the amorphous state. Crystallization temperature of Sb$_2$Te$_3$ is 102° C., melting temperature thereof is 593° C., and a resistance value in the crystalline state is 1000 times greater than that in the amorphous state. As the sputtering method is used for preparing, GeTe and Sb$_2$Te$_3$ targets are simultaneously struck, the substrate is rotated to the GeTe target whereby sputtering a GeTe film having a thickness of 5 nm, to the $Sb_2Te_3$ target whereby sputtering a $Sb_2Te_3$ film having a thickness of 2.5 nm, to the GeTe target whereby sputtering a GeTe film having a thickness of 5 nm, and then to the $Sb_2Te_3$ target whereby sputtering a $Sb_2Te_3$ film having a thickness of 2.5 nm, . . . and the above process is repeated for 20 times, and finally a GeTe/$Sb_2Te_3$ multi-layer phase change material having thickness of 150 nm is obtained.

The same method as above is used to prepare a 10-cycle GeTe/$Sb_2Te_3$ multi-layer phase change material (in which a single-layer GeTe and Sb2Te3 respectively has thickness of 10 nm and 5 nm, and overall thickness thereof is 150 nm), a 30-cycle GeTe/$Sb_2Te_3$ multi-layer phase change material (in which a single-layer GeTe and Sb2Te3 respectively has thickness of 5 nm and 2.5 nm, and overall thickness thereof is 150 nm), and a 50-cycle GeTe/$Sb_2Te_3$ multi-layer phase change material (in which a single-layer GeTe and Sb2Te3 respectively has thickness of 2 nm and 1 nm, and overall thickness thereof is 150 nm).

The same method as above is used to prepare a 75-cycle $Ge_1Sb_2Te_4$/$Ge_2Sb_2Te_5$ multi-layer phase change material, in which a single-layer $Ge_1Sb_2Te_4$ and $Ge_2Sb_2Te_5$ respectively has thickness of 1 nm and 1 nm. The two phase change materials have the same composition elements but different atomic percentages, and a stable crystalline phase can be formed. Crystallization temperature of $Ge_1Sb_2Te_4$ is 154° C., melting temperature thereof is 603° C., and a resistance value in the crystalline state is 1000 times greater than that in the amorphous state. As for $Ge_2Sb_2Te_5$, crystallization temperature thereof is 175° C., melting temperature thereof is 625° C., and a resistance value in the crystalline state is 10000 times greater than that in the amorphous state.

The same method as above is used to prepare a 75-cycle $Sb_2Te_3$/$Sb_7Te_3$ multi-layer phase change material. The two phase change materials have the same composition elements but different atomic percentages. The thickness of the single-layer $Sb_2Te_3$ and $Sb_7Te_3$ is respectively 1 nm and 1 nm, $Sb_2Te_3$ is a homogeneous crystal, and $Sb_7Te_3$ is a eutectic phase, the multi-layer film structure formed whereby features stable phase change temperature and resistance difference.

The same method as above is used to prepare multi-layer phase change materials such as SnTe/GeSe, AsTe/SbSe, Sb2Te3/AgInSbTe and so on.

The same method as above is used to prepare a 75-cycle doping-type $(Bi_2Te_3)_{1-x}Si_x$/$(Bi_2Te_3)_{1-y}Si_y$ multi-layer phase change material, where subscripts x and y represent percentages of Si element mixed in the phase change material $Bi_2Te_3$, and x and y are not equal to each other. The two phase change materials have the same composition elements but different atomic percentages. By mixing proper amount of Si element in the phase change material $Bi_2Te_3$, phase change temperature and thus stability of the material can be improved. Depending on the percentage of Si element mixed in $Bi_2Te_3$, crystallization temperature of the single-layer phase change material can be changed from 60° C. to 200° C., and melting temperature thereof can be changed from 580° C. to 700° C.

Generally, an atomic percentage of doping elements in the single-layer phase change material is between 0.5% and 50%, namely values of the subscripts x and y are between 0.005 and 0.5. Few doping elements cannot significantly improve performance of the phase change material, while too many doping elements are to destroy crystal structure of the phase change material and thus resulting in loss of phase change performance thereof.

The same method as above is used to prepare a 75-cycle doping-type $(Ge_2Sb_2Te_5)_{1-x}N_x$/$(Ge_2Sb_2Te_5)_{1-y}N_y$ multi-layer phase change material, where subscripts x and y represent percentages of Si element mixed in the phase change material $Ge_2Sb_2Te_5$, and x and y are not equal to each other. The two phase change materials have the same composition elements but different atomic percentages. By mixing proper amount of N element in the phase change material $Ge_2Sb_2Te_5$, erasing times and work life thereof can be improved.

Similarly, by mixing elements such as O, S, Ag, Au and so on in the phase change material, grain size of the single-layer phase change material can be refined, and thus stability thereof can be improved. The phase change material after mixing as the single-layer phase change material can form a multi-layer phase change material such as $(SnSe)_{1-x}O_x$/$(SnSe)_{1-y}O_y$, $(BiSe)_{1-x}S_x$/$(BiSe)_{1-y}S_y$, $(AsSe)_{1-x}Ag_x$/$(AsSe)_{1-y}Ag_y$, $(InSe)_{1-x}Au_x$/$(InSe)_{1-y}Au_y$ and so on.

Generally, two phase change materials having the same composition element but different atomic percentage thereof normally have the same crystal structure and close lattice constant, and the formed multi-layer phase change material has the same crystal structure, which is referred to as a superlattice structure in crystallography.

The invention uses a sputtering method to prepare a group of samples for testing the thermal conductivity of the multi-layer phase change material of the invention. Firstly $S_3N_4$ or $SiO_2$ having thickness of 10 nm is sputtered on the Si substrate as an insulating and heat conducting material (thermal conductivity of $S_3N_4$ is 15.5 W/mK, and is far greater than that of the phase change material so that effect thereof on test results can be neglected), then the multi-layer phase change material having thickness of 150 nm is sputtered on $S_3N_4$ or $SiO_2$, and a $S_3N_4$ or $SiO_2$ layer having thickness of 10 nm is covered on the surface of the multi-layer phase change material of the invention, and finally a 'I'-shaped electrode is made on the surface of $S_3N_4$ or $SiO_2$ at the top via a photoetching method, the electrode being made of a Ag film having thickness of 800 nm.

By applying the samples to the '3ω' method, test results of thermal conductivity of various phase change materials are illustrated in the following Table 1:

TABLE 1

Test results of thermal conductivity of various phase change materials

| | Material | | | |
|---|---|---|---|---|
| | GeTe | $Sb_2Te_3$ | $Ge_2Sb_2Te_5$ | $Ge_1Sb_2Te_4$/$Ge_2Sb_2Te_5$ multi-layer phase change material |
| Thermal conductivity (W/mK) | 0.25 | 0.28 | 0.30 | 0.12 |

In table 1, GeTe, $Sb_2Te_3$ and $Ge_2Sb_2Te_5$ are common-used phase change materials, and thickness thereof is 150 nm in the test sample. The $Ge_1Sb_2Te_4$/$Ge_2Sb_2Te_5$ multi-layer phase change material is an embodiment of the multi-layer phase change material of the invention, $Ge_1Sb_2Te_4$ and $Ge_2Sb_2Te_5$ forming the multi-layer phase change material respectively has thickness of 1 nm and 1 nm. The two materials alternately grow for 75 cycles. and thickness of film is 150 nm. Test results show that the thermal conductivity of the multi-layer phase change material of the invention is far less than that of common-used phase change materials.

Using the same method as above, thermal conductivity of three $GeTe/Sb_2Te_3$ multi-layer phase change materials (thickness of the single-layer GeTe and Sb2Te3 thereof is 10 nm and 5 nm, 5 nm and 2.5 nm, and 2 nm and 1 nm, the number of cycles is 10, 20 and 30, and thickness of film is 150 nm) is tested, and test results are respectively 0.24 W/mK, 0.23 W/mK, and 0.18 W/mK. This indicates that as thickness of the single-layer phase change material is greater than 5 nm, reduction in thermal conductivity is not very significant. As thickness of the single-layer phase change material is equal to or less than 5 nm, the thermal conductivity of the phase change material will be greatly reduced.

Moreover, thermal conductivity of another $Bi_2Te_3/Sb_2Te_3$ multi-layer phase change material is tested via the same method as above, thickness of $Bi_2Te_3$ and $Sb_2Te_3$ forming the multi-layer phase change material is respectively 0.5 nm and 0.5 nm, The two materials alternately grow for 75 cycles, and both belong to a rhombohedral and triangle crystal system although they are formed by different elements, lattice constants thereof are close to each other, lattice mismatch therebetween is less than 5%, and therefore the multi-layer phase change material becomes a superlattice phase change material in crystallography. After a test, thermal conductivity of the material is only 0.11 W/mK, which is even smaller than that of the 20-cycle $GeTe/Sb_2Te_3$ multi-layer phase change material in Table 1.

It can be seen from the above simulation results that reduction in the thermal conductivity of the phase change material can effectively prevent heat diffusion, and reduce thermal interference between adjacent memory cells. The test indicates that after a memory cell of a PCRAM employing the $Ge_1Sb_2Te_4/Ge_2Sb_2Te_5$ multi-layer phase change material is erased for millions of times, variation in a resistance value of the adjacent memory cell is less than 0.01%.

Figure 8:
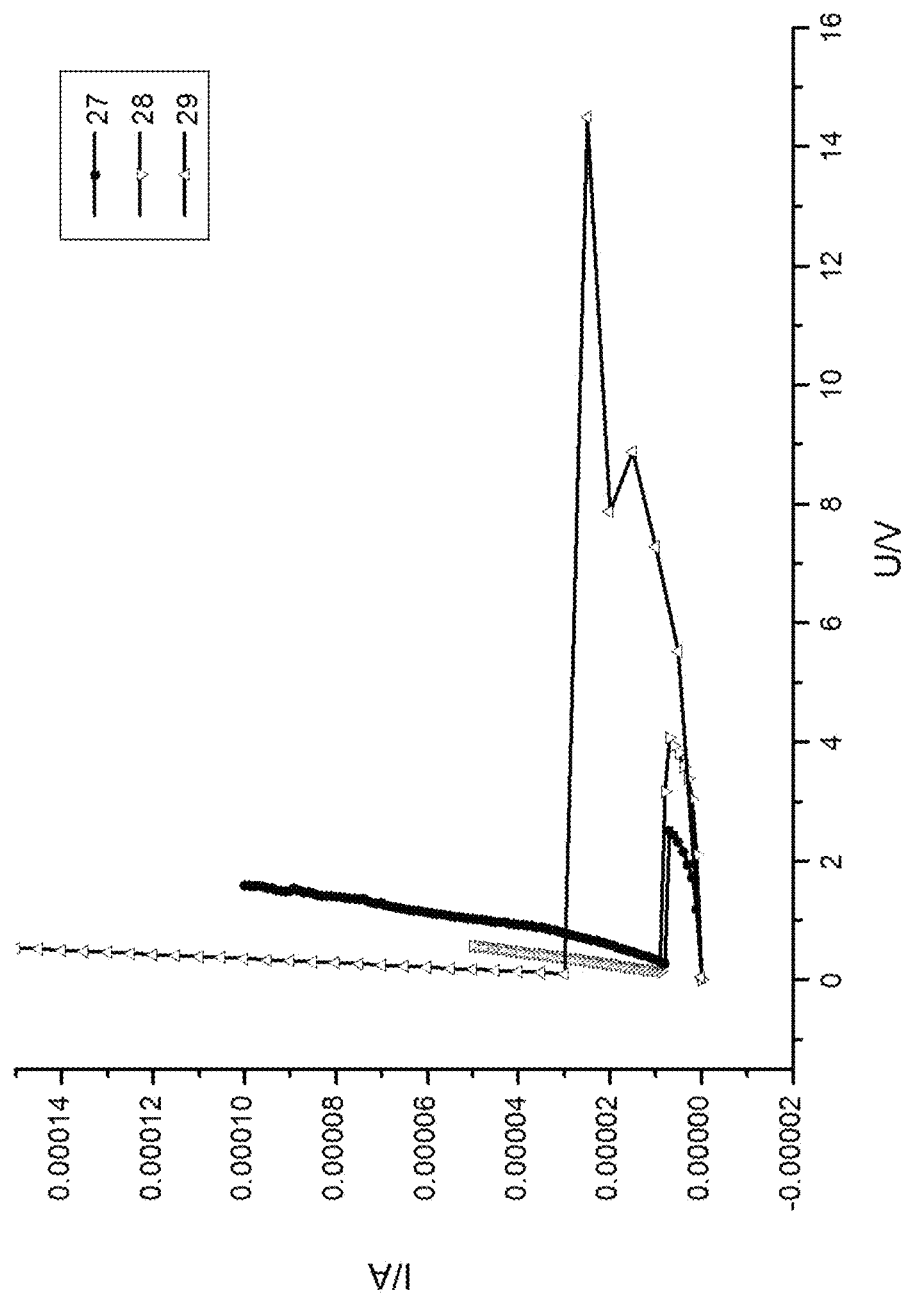
FIG. 8 illustrates comparison between a threshold voltage of a multi-layer phase change material of the invention and that of a common-used phase change material.

FIG. 8 illustrates comparison between a threshold voltage of a multi-layer phase change material of the invention and that of a common-used phase change material. A curve 27 represents a direct-current I-V curve of the multi-layer phase change material of the invention, the multi-layer phase change material comprises $Ge_1Sb_2Te_4$ and $Ge_2Sb_2Te_5$, and thickness of a single-layer $Ge_1Sb_2Te_4$ and $Ge_2Sb_2Te_5$ is respectively 1 nm and 1 nm, the number of cycles of the material is 75, and thickness thereof is 150 nm. A curve 28 represents a direct-current I-V curve of Ge2Sb2Te5, and a curve 29 represents a direct-current I-V curve of Ge2Sb2Te5 mixed with N element. It can be seen that threshold voltages of these three materials are respectively 2.5 V, 4.1 V, and 14.5 V, and a threshold voltages of the 75-cycle $Ge_1Sb_2Te_4/Ge_2Sb_2Te_5$ multi-layer phase change material is the minimum. The threshold value indicates difficulty of phase change of a phase change material occurring under electric pulses, the greater the threshold value of a material is, the more energy is required for facilitating phase change, and thus power consumption of a memory operating as a recording material is higher. Ge2Sb2Te5 mixed with N element is normally used to improve stability of a memory, but it can be seen from the above test results that power consumption thereof is too high. Experiment results indicate that the multi-layer phase change material of the invention can significantly reduce power consumption of the memory by decreasing thermal interference of adjacent memory cells.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A multi-layer phase change material, comprising: a multi-layer film structure, said multi-layer film structure comprising a plurality of periodic units, said periodic units each comprising a first single-layer film phase change material and a second single-layer film phase change material, wherein:
    said first single-layer film phase change material and said second single-layer film phase change material are alternately stacked and are in contact with each other;
    each of said first single-layer film phase change material and said second single-layer film phase change material is changeable from an amorphous state to a crystalline state by a first electric pulse and is changeable from the crystalline state to the amorphous state by a second electric pulse;
    said first single-layer film phase change material consists of a first plurality of chemical components;
    said second single-layer film phase change material consists of a second plurality of chemical components;
    said first plurality of chemical components are the same as said second plurality of chemical components and a percent composition of said first plurality of chemical components is different from a percent composition of said second plurality of chemical components;
    a crystal structure of said first single-layer film phase change material and a crystal structure of said second single-layer film phase change material belong to a same lattice system; and
    a lattice mismatch between said first single-layer film phase change material and said second single-layer film phase change material is less than 10%.

2. The multi-layer phase change material of claim 1, wherein said first or said second single-layer film phase change material is a one selected from the group consisting of GeTe, SbTe, BiTe, SnTe, AsTe, GeSe, SbSe, BiSe, SnSe, AsSe, InSe, GeSbTe, and AgInSbTe, or a mixture formed by doping any one thereof with an element of S, N, O, Cu, Si, or Au.

3. The multi-layer phase change material of claim 2, wherein said first or said second single-layer film phase change material is said mixture formed by doping, and an atomic percentage of the mixed element in said first or said second single-layer film phase change material is between 0.5% and 50%.

4. The multi-layer phase change material of claim 1, wherein a thickness of said first or said second single-layer film phase change material is between 0.5 nm and 5 nm.

5. The multi-layer phase change material of claim 2, wherein a thickness of said first or said second single-layer film phase change material is between 0.5 nm and 5 nm.

6. The multi-layer phase change material of claim 3, wherein a thickness of said first or said second single-layer film phase change material is between 0.5 nm and 5 nm.

7. A sample for testing thermal conductivity of the multi-layer phase change material of claim 1, the sample comprising two layers made of an electrically insulating and heat conducting material, and a multi-layer phase change material, wherein:
    said multi-layer phase change material is disposed between said two layers;
    one of said two layers is deposited on a Si substrate; and
    a metal strip is deposited on the other of said two layers.

8. The sample of claim 7, wherein a thermal conductivity of said electrically insulating and heat conducting material is greater than 1 W/mK.

9. The sample of claim 7, wherein a thickness of said electrically insulating and heat conducting material is between 5 nm and 20 nm.

10. The sample of claim 8, wherein a thickness of said electrically insulating and heat conducting material is between 5 nm and 20 nm.

11. The sample of claim 7, wherein the metal strip is I-shaped.

12. The sample of claim 8, wherein the metal strip is I-shaped.

13. A phase change random access memory, comprising a plurality of memory cells each made of the multi-layer phase change material of claim 1.

* * * * *